(12) United States Patent
Ouyang et al.

(10) Patent No.: US 6,351,172 B1
(45) Date of Patent: Feb. 26, 2002

(54) HIGH-SPEED OUTPUT DRIVER WITH AN IMPEDANCE ADJUSTMENT SCHEME

(75) Inventors: Paul H. Ouyang, San Jose; Joseph W. Ku, Palo Alto; Donald Liusie, San Jose, all of CA (US)

(73) Assignee: Dmel Inc., Santa Clara, CA (US)

( * ) Notice: Subject to any disclaimer, the term of this patent is extended or adjusted under 35 U.S.C. 154(b) by 0 days.

(21) Appl. No.: 09/515,220

(22) Filed: Feb. 29, 2000

(51) Int. Cl.$^7$ ................................................. H03L 5/00
(52) U.S. Cl. ....................................... 327/333; 327/112
(58) Field of Search ............................... 326/30, 85, 87, 326/91; 327/108, 109, 110, 111, 112, 318, 319, 333

(56) References Cited

U.S. PATENT DOCUMENTS

| | | | | |
|---|---|---|---|---|
| 5,057,711 A | * | 10/1991 | Lee et al. ..................... 307/443 |
| 5,122,690 A | * | 6/1992 | Bianchi ........................ 307/475 |
| 5,614,842 A | * | 3/1997 | Doke et al. ..................... 326/58 |
| 5,777,497 A | * | 7/1998 | Han ............................. 327/108 |
| 5,877,647 A | * | 3/1999 | Vajapey et al. ............... 327/391 |
| 5,894,238 A | * | 4/1999 | Chien ........................... 327/112 |
| 5,959,473 A | * | 9/1999 | Sakuragi ....................... 327/111 |
| 5,977,790 A | * | 11/1999 | Sanwo et al. .................. 326/27 |
| 6,066,958 A | * | 5/2000 | Taniguchi et al. ............. 326/27 |
| 6,094,086 A | * | 7/2000 | Chow ........................... 327/396 |
| 6,137,317 A | * | 10/2000 | Griffin .......................... 326/87 |
| 6,172,516 B1 | * | 1/2001 | Han et al. ...................... 326/27 |

* cited by examiner

Primary Examiner—Jeffrey Zweizig
(74) Attorney, Agent, or Firm—Eric Ho

(57) ABSTRACT

A dynamic impedance adjustment circuit that reduces overshoot and undershoot noise while achieving fast slew rates. The dynamic impedance adjustment circuit has an output driver for selectively driving or drawing current providing source or sink current. The dynamic impedance adjustment circuit also has an a variable impedance output driver for selectively providing a dynamic current (source or sink) for a predetermined time after transitions from a logic low level to a logic high level or from a logic high level to a low logic level in the input signal. An impedance adjustment control circuit is coupled to the variable impedance output driver for automatically detecting the transitions in the input signal and for changing the impedance of the variable impedance output driver based on the input signal, enable signal, and the output node.

17 Claims, 11 Drawing Sheets

US 6,351,172 B1

HIGH-SPEED OUTPUT DRIVER WITH AN IMPEDANCE ADJUSTMENT SCHEME

FIELD OF THE INVENTION

The present invention relates generally to interface or output circuits employed in a semiconductor integrated circuit for driving a transmission line through which circuits are interconnected, and more particularly to a high-speed output driver with an impedance adjustment scheme.

BACKGROUND OF THE INVENTION

For a high-speed integrated circuit, the output driver design is always a challenge to the circuit designer. The function of an output driver is to provide additional current to drive the next stage of circuits or devices. This drive current needs to be delivered in a manner that does no impair the circuit performance. One measure of circuit performance is the rise/fall time, which is the time required for the output of the circuit to reflect changes in the input. For example, when the input signal transitions from a low logic level to a high logic level, the output also transitions from a low logic level to a high logic level within a predetermined rise time. Similarly, when the input signal transitions from a high logic level to a low logic level, the output also transitions from a high logic level to a low logic level within a predetermined fall time. As can be appreciated, the shorter the rise or fall time, the better the driver performs since the output reflects changes in the input more quickly and in a more responsive fashion than a driver that has a longer rise or fall time. The rise and fall times are also referred to herein as "propagation delay" (i.e., the time or delay needed before changes in the input are reflected in the output).

As applications require higher switching speeds, there is a constant pressure for circuit designers to reduce the propagation delay. One method to decrease the propagation delay is to decrease the output driver impedance. When the output driver impedance is decreased, the rise and fall time can be improved or shortened since more current is provided to charge or discharge the output load, thereby causing the output to reflect changes in the input more quickly.

Unfortunately, when the output driver impedance is decreased, the output driver impedance fails to match the impedance of the load. For example, a typical printed circuit board (PCB) trace has an impedance of 50 ohms to 60 ohms. This impedance mis-match or unmatched impedance causes the output to exhibit ringing. Accordingly, it is important for the output driver to provide sufficient drive current, with minimum ringing and within a predetermined rise/fall time.

To summarize, in order to deliver high current to the load, the output driver has to be at low impedance. However, when the impedance of the output does not match the impedance of the load, which for a typical PC trace is approximately 50 to 60 ohms, noise in the form of ringing (e.g., overshoot and undershoot) in the output. This ringing is undesirable since it increases the bus settling time and degrades the circuit performance.

Furthermore, in most of the high-speed electronic systems, many I/Os are interconnected resulting in large capacitance loading. In order to maintain high switching speed, large output drivers are utilized. Unfortunately, due to the inductive elements [L] of the packaging material and the large current, large noises [Ldi/dt], which are referred to as ground bouncing or $V_{DD}$ bouncing, are generated. This noise causes signal delays, signal degradation, and power supply stability problems.

One of the approaches to partially address the ground bouncing or $V_{DD}$ bouncing problem is described in U.S. Pat. No. 5563542. The '542 patent provides a scheme that breaks the output driver into two or more small drivers, and turns these drivers on at different times, thereby reducing the di/dt noise. However, this approach only offers limited noise improvement at the cost of slowing down the output speed.

Another approach to partially address the ground bouncing or $V_{DD}$ bouncing problem is described in U.S. Pat. No. 5,959,481. Again, this approach only offers limited noise improvement at the cost of increasing the propagation delay.

Another approach is Gunning Transceiver Logic (GTL) output or RAMBUS logic (RSL) that is well known in the industry. This approach is described in "Pentium Pro Processor GTL+ Guideline," AP-524 Intel, March 1996. In this approach, an open drain is connected to an outside resistor that is connected to a power source. When the output level is low, the output level is higher than ground due to parallel termination resistors. This reduced voltage swing improves speed and an 800 Mhz I/O speed can be achieved.

Unfortunately, this approach has the following drawbacks: 1) during output high, there are still noises generated (both overshoot and undershoot) of the supply voltage of the power source, commonly known as ringing, and 2) this approach has a large power dissipation. The output high noise degrades the speed. The large DC current is dissipated or wasted when the output is low. For example in a RAMBUS system, a 25 ohm resistor is typically used, resulting in a 0.9 volt output low dissipating 36 mA per I/O driver. For a RAMBUS chip where there are 18 I/Os, 540 mA or 1.2 Watt of power is dissipated. This power causes the chip to run "hot." When the temperature of the chip increases, the chip performance decreases, and the chip is less reliable.

Another approach is known as the HSTL logic (High Speed Transceiver Logic) that is described in Electronic Industries Association (EIA), JEDEC Standard No. 8–6 (JESD8-6), August 1995. In this approach the output swing is reduced by a 50-ohm resistor connected to a voltage source $V_{DD}/2$. Higher speed is achieved due to the reduced voltage swing. The reduced voltage in turn reduces the $V_{ss}$ and $V_{cc}$ noise. However, this approach also has the disadvantage of large power dissipation and the problems stemming therefrom.

FIG. 1 depicts a typical CMOS low impedance output driver driving a 50 ohms transmission line and a capacitance load. This scheme provides an output with ringing. FIG. 2 depicts a CMOS low impedance driver with a 25-ohm series-terminating resistor to drive an output load. This scheme adjusts the output impedance to match the load impedance. Accordingly, this scheme provides a relatively clean output with almost no ringing. However, the increased output impedance causes this scheme to have a longer propagation delay that does not meet the rise and fall time requirements of certain high-speed applications.

Accordingly, there remains a need for an output driver circuit that reduces overshoot and undershoot noise to acceptable levels while meeting timing requirements and that overcomes the disadvantages set forth previously.

SUMMARY OF THE INVENTION

It is one object of the present invention to provide an output circuit that has high switching speeds.

It is yet another object of the present invention to provide an output circuit that is lower in switching noise.

It is yet another object of the present invention to provide an output circuit that dissipates less power.

It is yet another object of the present invention to provide an output circuit that minimizes overshoot and undershoot noise.

It is yet another object of the present invention to provide an output circuit that provides sufficient drive current to achieve fast slew rates and meet stringent timing requirements.

It is yet another object of the present invention to provide an output circuit that improves the impedance match between the output circuit and the impedance of the transmission-line load.

It is another object of the present invention to provide an output circuit whose output speed is less sensitive to output capacitance loading.

A dynamic impedance adjustment circuit for meeting strict timing requirements while reducing overshoot and undershoot noise to acceptable levels is provided. The dynamic impedance adjustment circuit has a first input for receiving an input signal, a second input for receiving an enable signal, and an output coupled to an output node. The dynamic impedance adjustment circuit has an output driver, coupled to receive the input signal and the enable signal, for selectively providing source or sink current to a load. The dynamic impedance adjustment circuit also has a variable impedance output driver, coupled to the output node, for detecting transitions in the input signal from a logic low level to a logic high level or from a logic high level to a low logic level and selectively provides additional source or sink current, respectively, for a predetermined time. An impedance adjustment control circuit is coupled to the variable impedance output driver for controlling the operation of the variable impedance output driver based on the input signal, enable signal, and the output node.

In one embodiment, the impedance adjustment control circuit utilizes an output feedback driver that is coupled to the output node, a one-shot circuit for generating a one-shot output signal, and a pre-driver preset circuit that operates based on the one-shot output signal. The output feedback driver also includes a transmission gate that operates based on a modified input signal that is derived from the input signal and the enable signal.

In an alternative embodiment, the impedance adjustment control circuit utilizes an output feedback driver coupled to the output node and a pre-driver preset circuit that operates based on the input signal. The output feedback driver also includes a transmission gate that operates based on the input signal.

In yet another alternative embodiment, the impedance adjustment control circuit utilizes an delay input driver that operates based on a delayed version of the input signal and a pre-driver preset circuit that operates on the input signal. The delay input driver also includes a transmission gate that operates based on the input signal.

DETAILED DESCRIPTION

Figure 1:
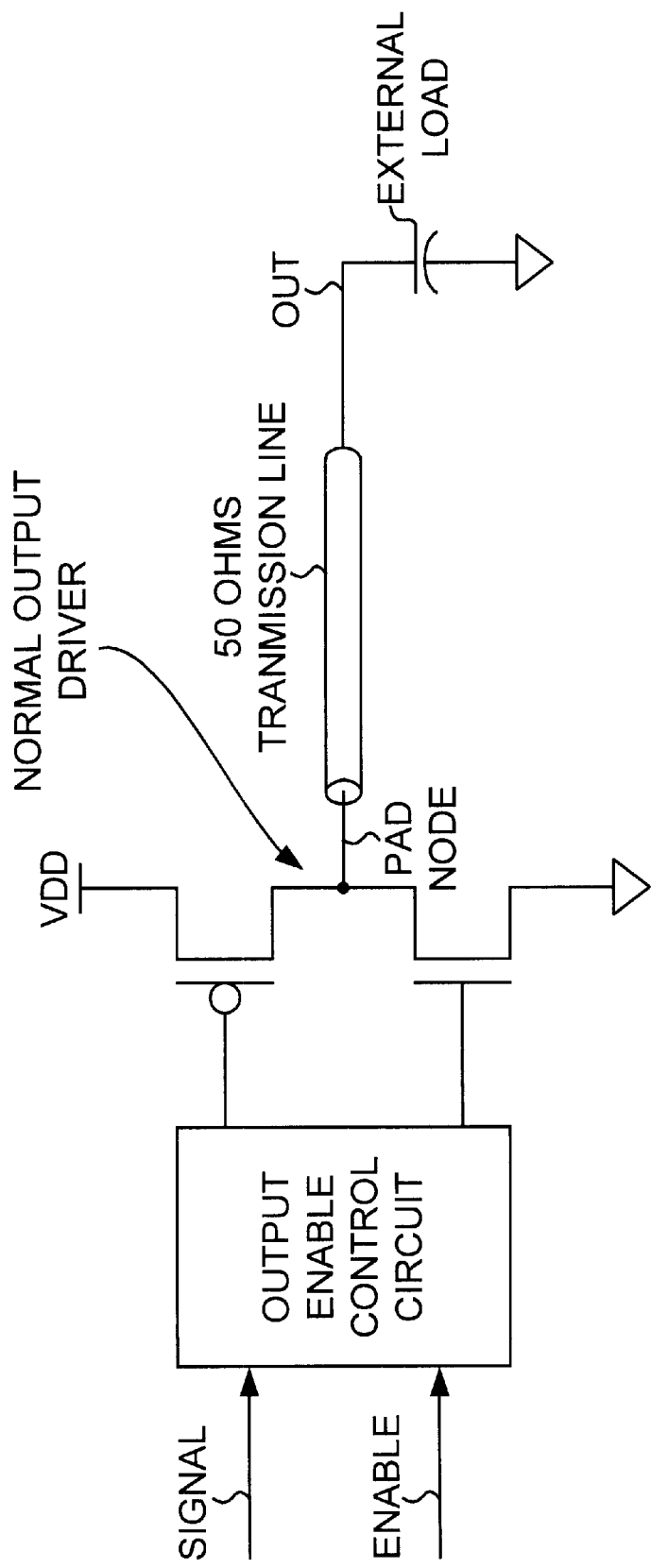
FIG. 1 is a block diagram illustrating a prior art output driver.

The subject invention will be described with reference to numerous details set forth below, and the accompanying drawings will illustrate the invention. The following description and the drawings are illustrative of the invention and are not to be construed as limiting the invention. Numerous specific details are described to provide a thorough understanding of the present invention. However, in certain instances, well-known or conventional circuits or device elements are not described in detail in order not to obscure unnecessarily the present invention. In the drawings, the same element is labeled with the same reference numeral.

The present invention provides a novel interface circuit that has a high output speed and minimal ringing. The interface circuit has an input for receiving an input signal that has a low logic level and a high logic level and at least one low to high transition and a high to low transition. One aspect of the present invention is the provision of a dynamic impedance output driver for providing a dynamic drive or sink current for a predetermined period of time after a transition in the input signal (e.g., a high-to-low transition or a low-to-high transition). The present invention detects the low-to-high transition in the input signal and provides additional drive current for a predetermined time after the low-to-high transition and detects the high-to-low transition and provides sink current for a predetermined time after the high to low transition.

The present invention includes an impedance adjustment control circuit to a standard CMOS output driver, which controls the output driver circuit to sink or source high current first. When the transition approaches the end, the output impedance automatically adjusts to match the impedance of the transmission line. Hence, this type of output driver has the capability to drive the output load ultra fast with minimum bus ringing effect. The present invention can be used in many applications, for example, high speed CMOS interface circuit applications.

High Speed Output Driver Circuit 50

Figure 3:
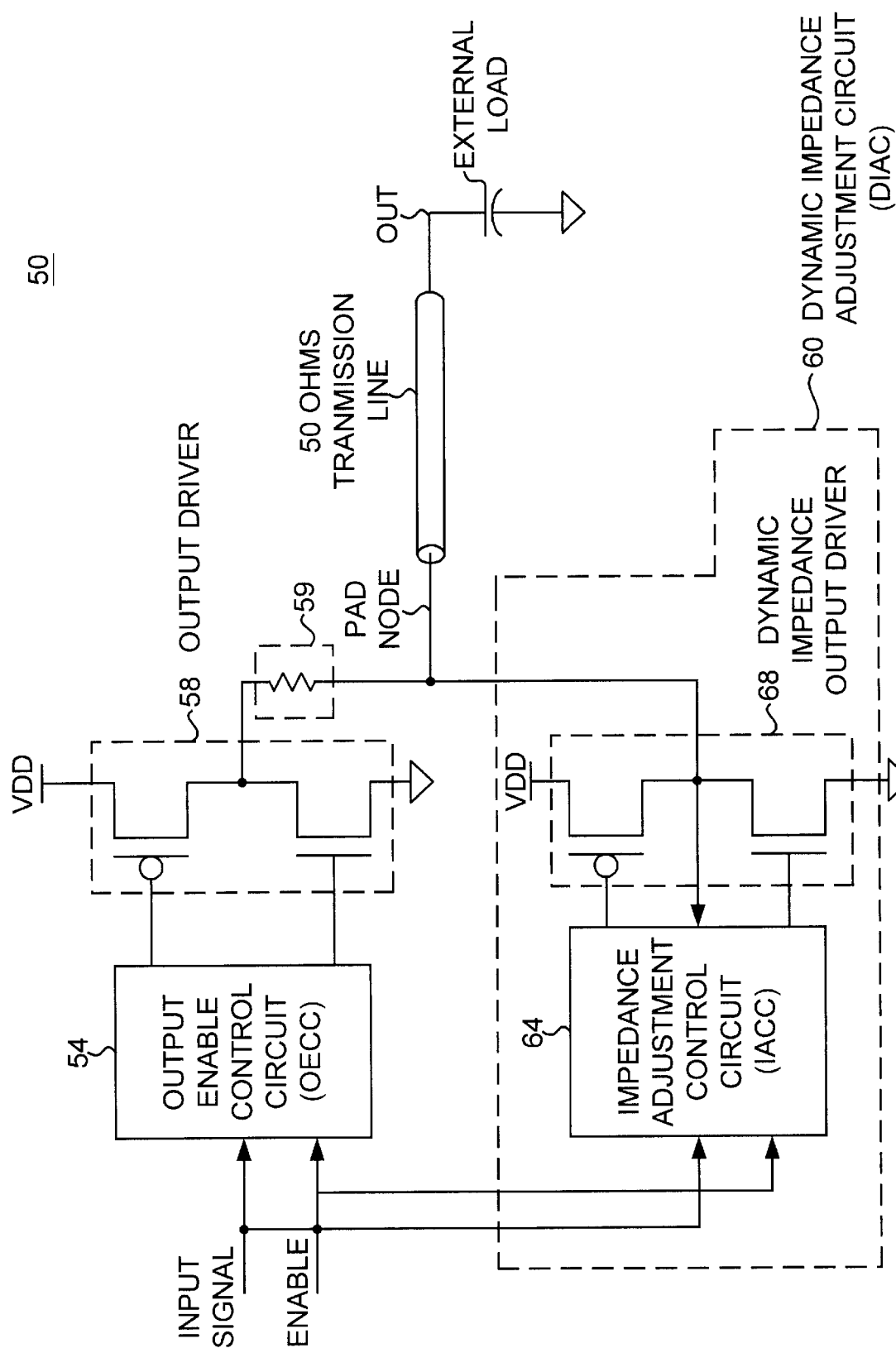
FIG. 3 is a block diagram illustrating a dynamic impedance adjustment circuit configured in accordance with one embodiment of the present invention.

FIG. 3 is a block diagram illustrating a high speed output driver 50 configured in accordance with one embodiment of the present invention. The high speed output driver 50 includes an output enable control circuit (OECC) 54, a output driver 58 for providing a static output current, and a dynamic impedance adjustment circuit (DIAC) 60 for selectively providing a dynamic output current during transition in the input signal. A resistor 59 can be coupled between the output driver 58 and the PAD node. The value of the resistor 59 can vary and may be adjusted from a value of 0 to 25 ohms to suit a particular application. In some instances, the resistor 59 may be removed from the path between the output driver 58 and the PAD node. Preferably, the resistor 59 is included in this path.

The dynamic impedance adjustment circuit (DIAC) 60 includes an impedance adjustment control circuit (IACC) 64 and a variable impedance output driver 68. The output enable control circuit (OECC) 54 has a first input for receiving an input signal, a second input for receiving an enable signal, a first output and a second output for generating a first control signal and a second control signal, respectively, based on the input signal and the enable signal. When the enable signal is de-asserted, the OECC 54 utilizes the first control signal and the second control signal to cause the output driver 68 to be in a high impedance state. When the enable signal is asserted, the OECC 54 utilizes the first control signal and the second control signal to cause the output driver 68 to generate an output that reflects the voltage level of the input signal.

The output driver 58 provides drive current or sink current during a predetermined time period after switching of the input signal. The output driver 58 has a first transistor I1 for providing drive current to charge the OUT node in response to low-to-high transitions in the input signal and a second transistor I2 for providing sink current to discharge the OUT node in response to high-to-low transitions in the input signal. In this example, the first transistor I1 can be a p-channel device, and the second transistor I2 can be an n-channel device.

The first transistor I1 (also referred to as a pull-up transistor) includes a drain electrode coupled to the output node, a source electrode coupled to a first predetermined voltage (e.g., $V_{DD}$), and a gate electrode for receiving the first control signal from the OECC 54. The second transistor I2 (also referred to as a pull-down transistor) includes a drain electrode coupled to the output node, a source electrode coupled to a second predetermined voltage (e.g., ground potential (GND)), and a gate electrode for receiving the second control signal from the OECC 54.

The impedance adjustment control circuit (IACC) 64 includes a first input for receiving the input signal and a second input for receiving the enable signal and a third input for receiving a signal from the OUT node. Based on these inputs, the IACC 64 selectively generates a first control signal and a second control signal for controlling transistor I3 and transistor I4, respectively. By adjusting the pulse width of the control signal provided to transistors I19 or I21, the pulse width of the control signals at nodes X and Y can be modified. In turn, the control signals and the voltage at nodes X and Y determines how much dynamic current is provided by the output driver of the present invention.

The IACC 64 detects edge transitions in the input signal and changes in on the output node. Based on the transitions and changes, the impedance adjustment control circuit (IACC) 64 selectively changes the impedance of the variable impedance output driver 68 for a predetermined time period.

The variable impedance output driver 68 provides additional AC drive current or sink current during a predetermined time period after switching of the input signal. This AC output current is also referred to herein as "dynamic" current. The variable impedance output driver 68 has a first transistor 70 for providing dynamic drive current in response to low-to-high transitions in the input signal and a second transistor 72 for providing dynamic sink current in response to high-to-low transitions in the input signal. In this example, the first transistor 70 can be a pchannel device, and the second transistor 72 can be an n-channel device.

The first transistor 70 includes a drain electrode coupled to the output node, a source electrode coupled to a first predetermined voltage (e.g., $V_{DD}$), and a gate electrode for receiving the first control signal from IACC 64. The second transistor 72 includes a drain electrode coupled to the output node, a source electrode coupled to a second predetermined voltage (e.g., ground potential), and a gate electrode for receiving the second control signal from IACC 64.

Figure 4:
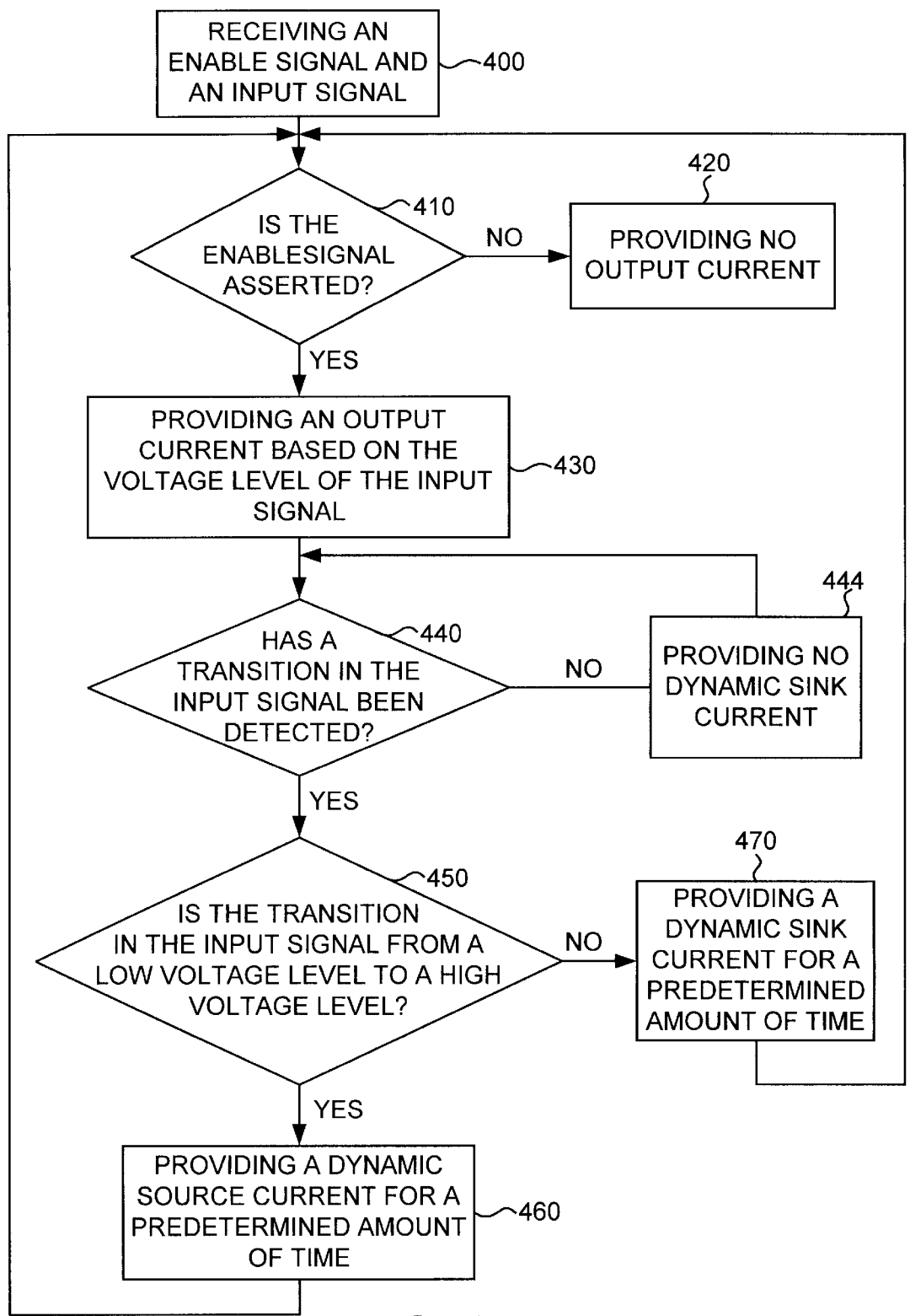
FIG. 4 is a flowchart illustrating the steps performed by the dynamic impedance adjustment circuit of FIG. 3.

FIG. 4 is a flowchart illustrating the steps performed by the dynamic impedance adjustment circuit of FIG. 3. In step 400, an enable signal and an input signal are received. In decision block 410, it is determined whether the enable signal is asserted. If no, in step 420, no output current is provided (i.e., the DIA circuit is in a high impedance state). If yes, in step 430, an output current is provided based on the voltage level of the input signal. For example, when the input signal is at a logic high level, an output current (referred to as a source current) is provided to charge the output node. Similarly, when the input signal is at a logic low level, an output current (referred to as a sink current) is provided to discharge the output node.

In decision block 440, a transition in the input signal is detected. If no, in step 444, no dynamic output current is provided. Processing continues to loop to block 440 until a transition is detected. If yes, in decision block 450, it is determined whether the transition in the input signal is from a low voltage level to a high voltage level. If yes, in step 460, a dynamic source current is provided for a predetermined amount of time. Otherwise, in step 470 the transition in the input signal is from a high voltage level to a low voltage level, and a dynamic sink current is provided for a predetermined amount of time.

Figure 2:
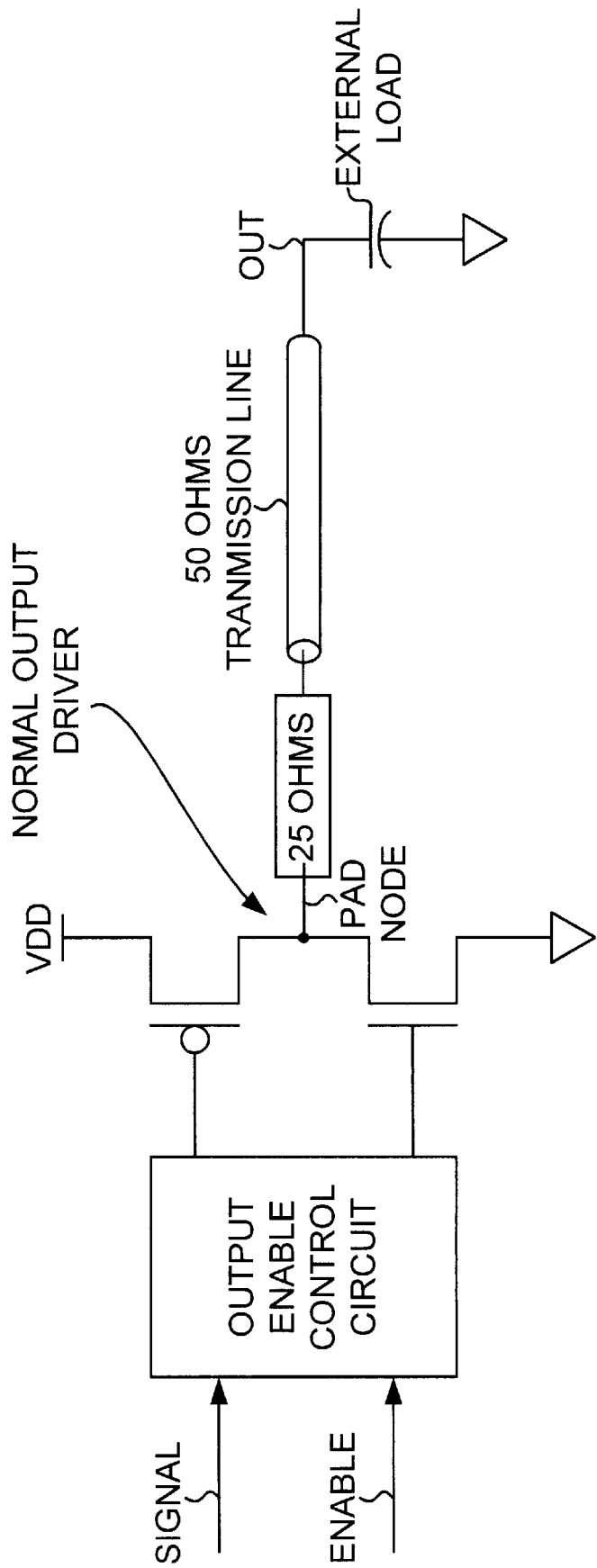
FIG. 2 is a block diagram illustrating another prior art output driver that utilizes a series resistor.
Figure 7:
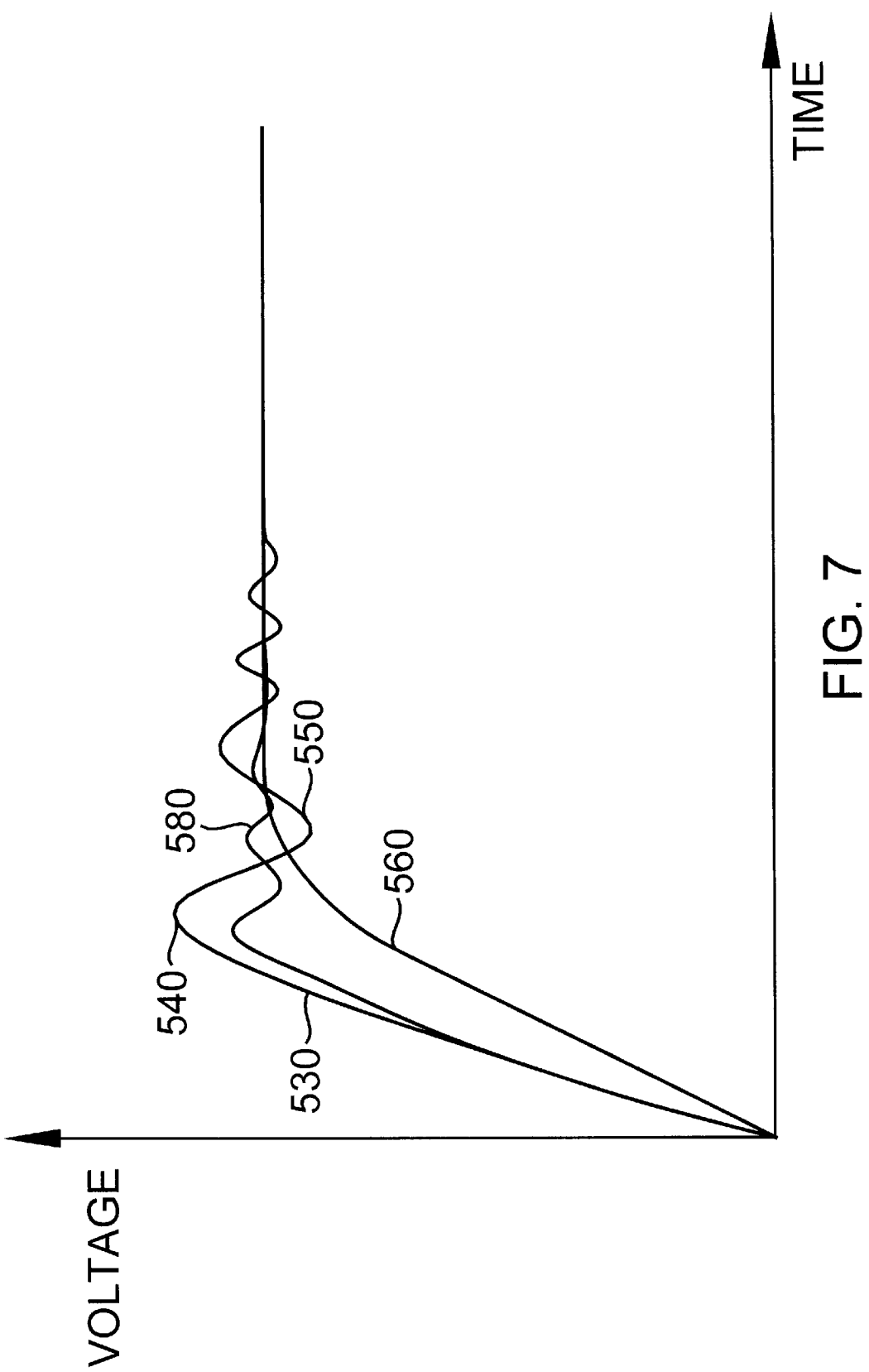
FIG. 7 is a graph illustrating the output waveforms for the circuits illustrated in FIGS. 1–3.

FIG. 7 is a graph illustrating exemplary output waveforms 530, 560, 580 for the circuits illustrated in FIGS. 1–3, respectively, for a low-to-high transition on the input. These output waveforms are in response to an input waveform having a rising edge (i.e., a low to high transition).

Output waveform 530 represents the output of the circuit of FIG. 1 without a terminating resistor. As is evident, waveform 530 exhibits undesirable ringing in the form of overshoot noise and undershoot noise (e.g., overshoot noise 540 and undershoot noise 550 following a low to high transition in the input). Similar ringing is exhibited following a high to low transition.

Output waveform 560 represents the output of the circuit of FIG. 2 with a 25 ohm terminating resistor. Although waveform 560 does not exhibit the overshoot noise and undershoot noise of waveform 530, the speed at which the output signal transitions from a low voltage level to a high voltage level or from a high voltage level to a low voltage level is reduced by the terminating resistor. In other words, the response the circuit of FIG. 2 is slower than that of FIG. 1 since more time is needed for the output signal of FIG. 2 to reach the same voltage level as the output signal of FIG. 1.

Exemplary output waveform 580 represents the output of the DIA circuit according to one embodiment of the present invention. As can be seen, waveform 580 exhibits minimal overshoot noise and undershoot noise, and has comparable switching speed as waveform 530. In other words, the response the DIA circuit of the present invention is as fast as the circuit of FIG. 1 with minimal ringing.

OUTPUT CONTROLLED IMPEDANCE ADJUSTMENT WITH ONE-SHOT CIRCUIT

Figure 5:
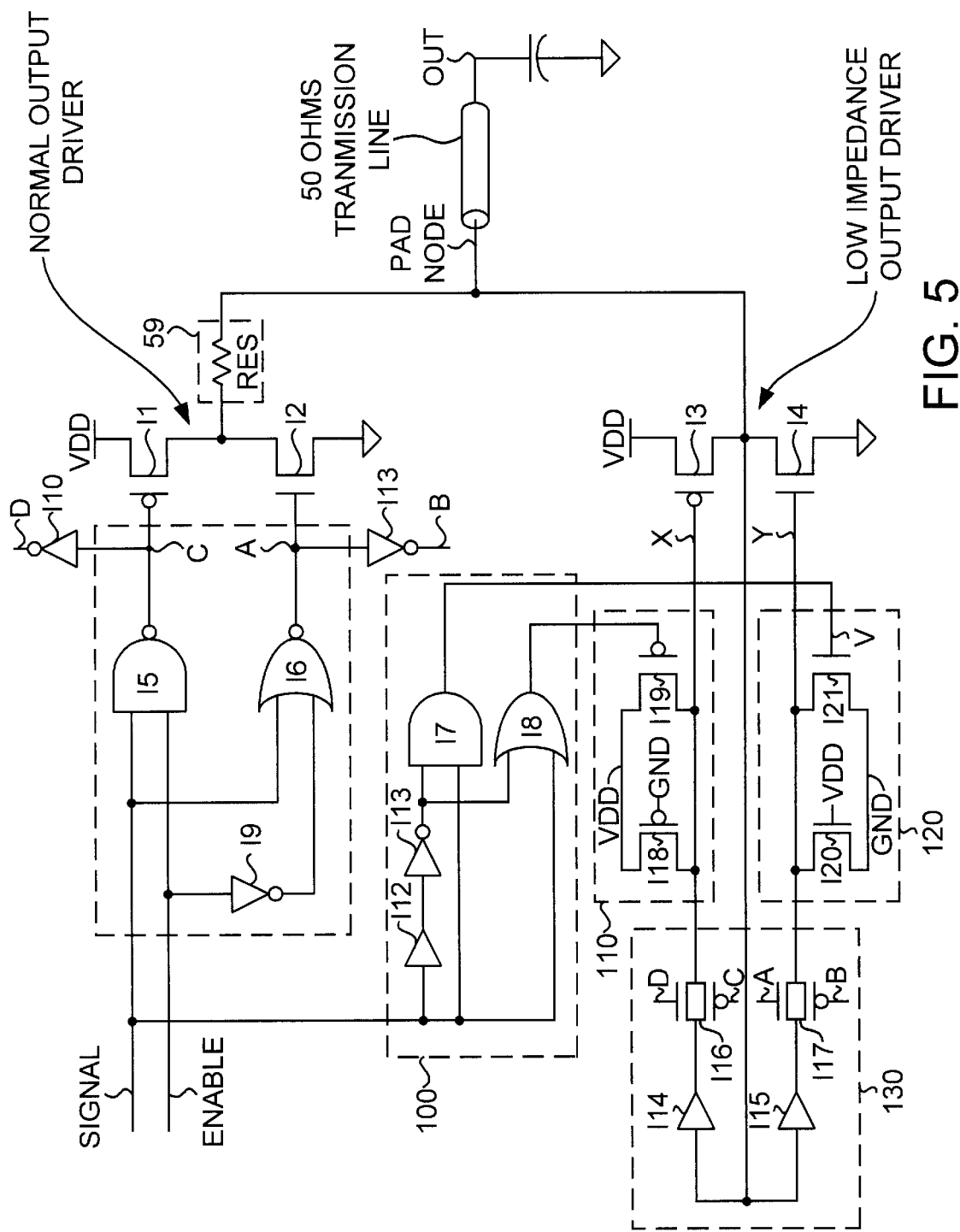
FIG. 5 is a circuit diagram illustrating in greater detail the dynamic impedance adjustment circuit of FIG. 3 according to a first embodiment of the present invention.

FIG. 5 is a circuit diagram illustrating in greater detail the high-speed output driver circuit 50 of FIG. 3 according to one embodiment of the present invention. The output driver 58 includes transistor 11 and transistor 12, which can be a 50-ohm driver that is driven by OECC 54. When the enable signal is asserted, the voltage level of the input signal sets the voltage on node A and the voltage on node C. Optionally, a resistor 59 is coupled between the output driver 58 and the PAD node.

For example, when both the input signal and the enable signal are at a logic high level, the voltage at both node A and C is set to be a low logic level so that transistor I1 (i.e., the pull-up transistor) is turned on and provides source current to charge up the external load, while transistor I2 (i.e., the pull-down transistor) is turned off. Similarly, when the input signal is at a logic low level, the voltage at node A and the voltage at node C are set to be a logic high level so that transistor I2 (i.e., the pull-down transistor) is turned on and provides a sink current for discharging the external load voltage, while transistor I1 (i.e., the pull-up transistor) is turned off.

The IACC 64 includes a one shot pulse generator 100, a first pre-driver preset circuit 110, a second pre-driver preset circuit 120 and an output feedback driver 130.

The one-shot pulse generator 100 can include a buffer I12, an inverter I13, an AND gate I7 and an OR gate I8. The one shot pulse generator 100 receives the input signal and based thereon selectively generates a first control signal for controlling transistor I21 and a second control signal for controlling transistor I19. Transistors I19 and I21 are described in greater detail hereinafter with reference to the first pre-driver preset circuit 110 and the second pre-driver preset circuit 120.

Depending on whether a rising edge or a falling edge is detected in the input signal, the one shot pulse generator 100 generates a pulse with the adjustable duration that is dependent on the propagation delay of the buffer I12 on the J node or the K node. This pulse temporarily turns off transistor I19 or I21 so that the voltage at the PAD output can set the voltage at nodes X or Y.

When the output is disabled, transistors I18 and I20 serve as a pull-up transistor and a pull-down transistor, respectively, to prevent the voltage at node X and node Y from floating. It is preferable that transistors I18 and I20 be weak transistors (i.e., transistors having a relatively narrow gate width) so that the voltage at node X can be changed by the voltage at the PAD node. Transistors I19 and I21 serve as de-coupling devices that de-couple the voltage at nodes X and Y from the PAD node.

When the output signal at the PAD node is rising or falling, nodes X and Y are affected by coupling voltages from the PAD node. The present invention provides transistors I19 and I21 so eliminate these undesirable coupling voltages. The output feedback driver 130 accepts the signal from the PAD node and drives the variable impedance output driver 68 through transmission gates I16 and I17. The transmission gates I16 and I17 are selectively opened based on the enable signal and the input signal.

Figure 6:
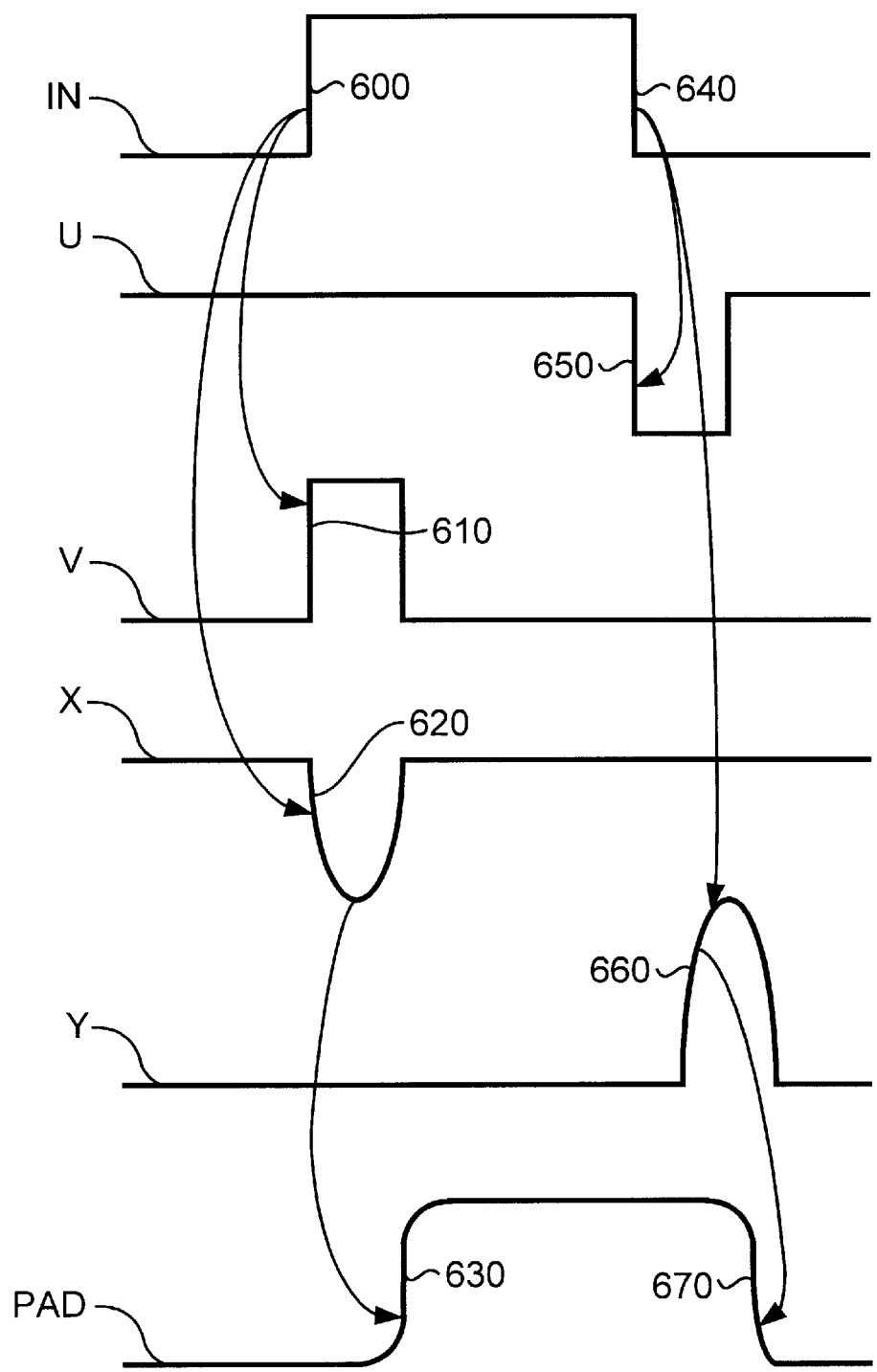
FIG. 6 is a timing diagram of selected signals utilized by the circuit of FIG. 5.

FIG. 6 is a timing diagram of selected signals utilized by the circuit of FIG. 5. FIG. 6 illustrates the input signal (IN), the signal at the output of gate I8, which is labeled as node U (U), the signal at the at the output of gate I7, which is labeled as node V (V), the signal at the gate of transistor I3, which is labeled as node X (X), the signal at the gate of transistor I4, which is labeled as node Y (Y), and the signal at the PAD node (PAD). The rising edge 600 of the IN signal causes the rising edge 610 of the V signal and the falling edge 620 of the X signal. The falling edge 620 of the X signal causes the rising edge 630 of the PAD signal. The falling edge 640 of the IN signal causes the falling edge 650 of the U signal and the rising edge 660 of the Y signal. The rising edge 660 of the Y signal causes the falling edge 670 of the PAD signal.

Transistor I1 and transistor I2 provide static source and sink currents, respectively. Transistor I3 and transistor I4 of the dynamic impedance output driver 68 of the present invention provide the dynamic (AC) source and sink output currents, respectively, during transitions in the input signal. These dynamic output currents are in addition to the static output currents provided by transistors I1 and I2.

The impedance adjustment control circuit 64 generates a first control signal and a second control signal. These control signals are provided to turn transistors I3 or I4 on for the time period, which in one embodiment is dependent on the width of the pulse. Depending on the situation, the width of these control signal pulses can be adjusted to turn on transistor I3 or I4 for a longer or short time period in order to suit a particular application.

Operation

When the enable signal is asserted (e.g., at a logic high level), the input signal selectively turns on transistor I1 or transistor I2 to drive the OUT node. During transitions in the input signal, the asserted enable signal and the input signal selectively turn on transistor I3 or transistor I4 for a pre-determined time when the "pad signal" is rising or falling.

If the input signal is transitioning from a low voltage level to a high voltage level (i.e., a rising edge is detected), node J maintains a high voltage level. Accordingly, coupling voltage on the node Y from changes in voltage on the PAD node is be discharged through transistor I21 thereby keeping transistor I4 off.

During this time, the signal at node K has a positive one-shot pulse that disables transistor I19 and maintains node X to VDD. During steady state, the voltage at node X is high due to the pull-up transistor I18. The voltage at nodes A and C is at a low level, and the voltages at nodes B and D are at a high level, thereby turning on transmission gate I16 and turning off transmission gate I17.

Accordingly, the initial low voltage signal on the PAD node drives the voltage at node X to a low voltage level through the buffer I14 and transmission gate I16. This low voltage level at node X turns on transistor I3, which in turn provides a high dynamic output current. However, as soon as the voltage at the PAD node approaches a high voltage level, transistor I3 is turned off by the rising voltage at node X. As soon as the output transition is completed, the low impedance output driver is disabled and becomes tri-stated from the PAD node. Thus, the output impedance matches the external load and minimizes the overshoot and undershoot noise.

When the input signal transitions from a high voltage level to a low voltage level, the present invention operates in a similar fashion to turn on transistor I4 to provide a dynamic sink current through buffer I15, transmission gate I17, and transistors I20 and I21.

OUTPUT CONTROLLED IMPEDANCE ADJUSTMENT

Figure 8:
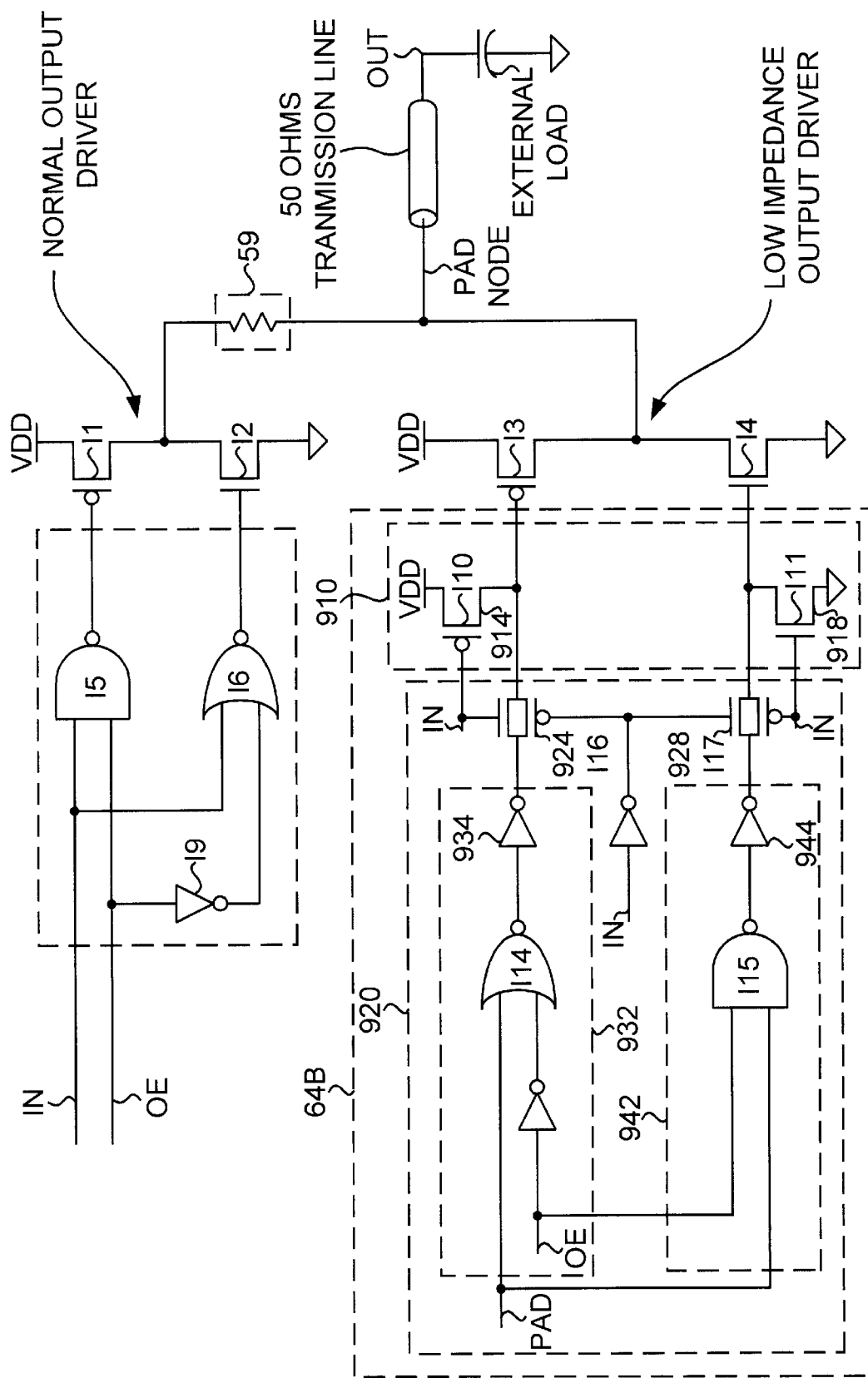
FIG. 8 is a circuit diagram illustrating in greater detail the dynamic impedance adjustment circuit of FIG. 3 according to a second embodiment of the present invention.

FIG. 8 is a circuit diagram illustrating in greater detail the dynamic impedance adjustment circuit of FIG. 3 according to a second embodiment of the present invention. In this embodiment, the impedance adjustment control circuit 64B is also driven by the output. However, unlike the first embodiment, circuit 64B does not employ a one-shot circuit, nor does circuit 64B utilize a modified signal based on the input signal and the enable signal. Instead, circuit 64B utilizes the input signal directly for pre-setting the voltage at nodes X and Y, as will be described in greater detail hereinafter. This embodiment is especially suitable for application where the output loading is such that ringing is below an acceptable level.

The impedance adjustment control circuit 64B includes a pre-driver preset circuit 910 for selectively setting nodes X and Y to predetermined voltages through transistors 914 and 918, respectively, based directly on the input IN signal. The impedance adjustment control circuit 64B also includes an output feedback driver 920 that includes a first transmission gate 924 and a second transmission gate 928 for selectively coupling the PAD signal to nodes X and Y, respectively based on the IN signal.

The output feedback driver 920 includes a first path 932 for providing dynamic drive to node X during transitions in the IN signal, and a second path 942 for providing dynamic drive to node Y during transitions in the IN signal. The first path 932 includes a NOR gate 934 having a first input coupled to receive the PAD signal and a second input coupled to a first inverter 936 that is coupled to receive an output enable (OE) signal. The NOR gate 934 includes an output coupled to a second inverter 938 that is coupled to the first transmission gate 924. The second path 942 includes a NAND gate 944 having a first input coupled to receive the OE signal and a second input coupled to receive the PAD signal, and an output coupled to a third inverter 946 that is coupled to the second transmission gate 928.

Figure 9:
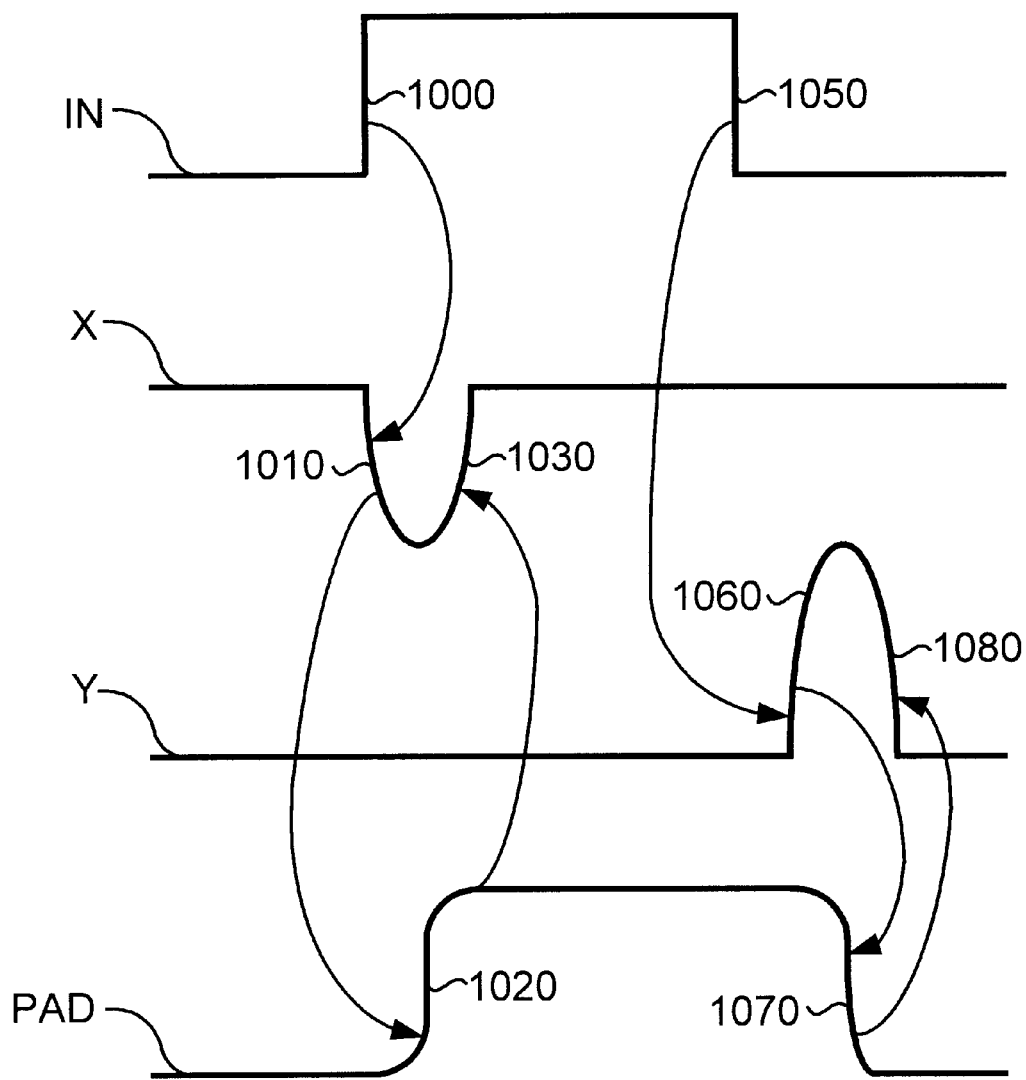
FIG. 9 is a timing diagram of selected signals utilized by the circuit of FIG. 8.
Figure 10:
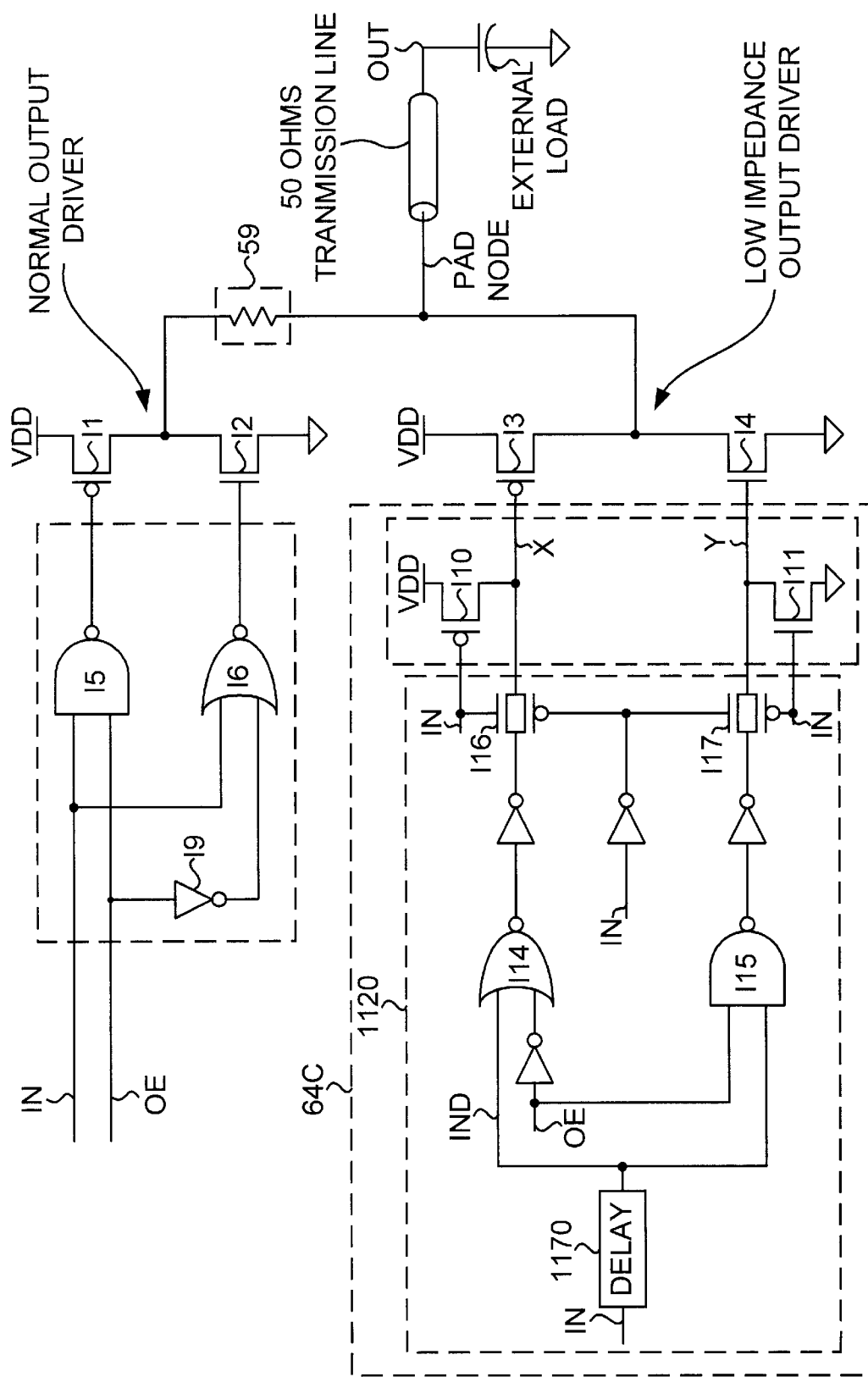
FIG. 10 is a circuit diagram illustrating in greater detail the dynamic impedance adjustment circuit of FIG. 3 according to a third embodiment of the present invention.

FIG. 9 is a timing diagram of selected signals utilized by the circuit of FIG. 8 and is used herein to explain the operation of the circuit 64B. FIG. 10 illustrates the input signal (IN), the signal at the gate of transistor I3, which is labeled as node X (X), the signal at the gate of transistor I4, which is labeled as node Y (Y), and the signal at the PAD node (PAD). The rising edge 1000 of the IN signal causes the falling edge 1010 of the X signal, which in turn causes the rising edge 1020 of the PAD signal. The rising edge 1020 of the PAD signal triggers the rising edge 1020 of the X signal. Similarly, the falling edge 1050 of the IN signal causes the rising edge 1060 of the Y signal, which in turn causes the falling edge 1070 of the PAD signal. The falling edge 1070 of the PAD signal triggers the falling edge 1080 of the Y signal.

The operation of the impedance adjustment control circuit 64B is as follows. During the steady state, when the IN signal is at a logic low level, transistor 914 is on, causing the voltage at node X to be $V_{DD}$, thereby keeping the 13 transistor off. It is noted that transmission gate 924 is disabled so that the voltage at the PAD node does not affect the voltage at node X. Also, during this steady state, transistor 918 is off, and the transmission gate 928 is enabled. Accordingly, the voltage at node Y reflects the voltage at the output of the second path 942 that is dependent on the voltage at the PAD node through transmission gate 928. The voltage at the PAD node is a low voltage during this state, which causes the output of the second path 942 to be a high voltage, which keeps the 14 transistor that provides a path to ground for the PAD node.

When the IN signal switches from a logic low level to a high logic level, transmission gate 928 is disabled, and transistor 918 is turned on, thereby causing the voltage at node Y to be at a ground level turning the 14 transistor off. Furthermore, during switching, transistor 914 is turned off, and transmission gate 924 is enabled, thereby providing a path for the voltage at node X to be discharged through transmission gate 924 and inverter 934 to ground. Also, during this time, transistor I3 provides a large current pulse to charge up output load. As the voltage of the PAD node increases, the voltage at node X is charged again to a high voltage level (i.e., the voltage at the PAD node is reflected at node X).

During the steady state, when the IN signal is at a logic high level, transistor 918 is on, causing the voltage at node Y to be ground, thereby keeping the 14 transistor off. It is noted that transmission gate 928 is disabled so that the voltage at the PAD node does not affect the voltage at node Y. Also, during this steady state, transistor 914 is off, and the transmission gate 924 is enabled. Accordingly, the voltage at node X reflects the voltage at the output of the first path 932 that is dependent on the voltage at the PAD node through transmission gate 924. The voltage at the PAD node is a high voltage during this state, which causes the output of the first path 932 to be a low voltage, which keeps the 13 transistor that provides a path to $V_{DD}$ for the PAD node.

When the IN signal switches from a logic high level to a low logic level, transmission gate 924 is disabled, and transistor 914 is turned on, thereby causing the voltage at node X to be at $V_{DD}$ turning the 13 transistor off. Furthermore, during switching, transistor 918 is turned off, and transmission gate 928 is enabled, thereby providing a path for the voltage at node Y to be charged up through transmission gate 928. As the voltage of the PAD node decreases, the voltage at node Y is discharged again to a low voltage level, following the PAD node (i.e., the voltage at the PAD node is reflected at node Y).

INPUT CONTROLLED IMPEDANCE ADJUSTMENT

FIG. 10 is a circuit diagram illustrating in greater detail the dynamic impedance adjustment circuit of FIG. 3 according to a third embodiment of the present invention. In this embodiment, the impedance adjustment control circuit 64C is driven by the input. This embodiment is especially suitable for application where the output loading is such that the ringing is above an acceptable level. The structure of circuit 64C is similar to that described with reference to FIG. 8 and for the sake of brevity will not be repeated herein. The main difference is that the output feedback driver 920 is replaced with a delay input driver 1120 that includes a delay 1170 for receiving the input signal (IN) and generating a delayed version of the input signal (IND).

Figure 11:
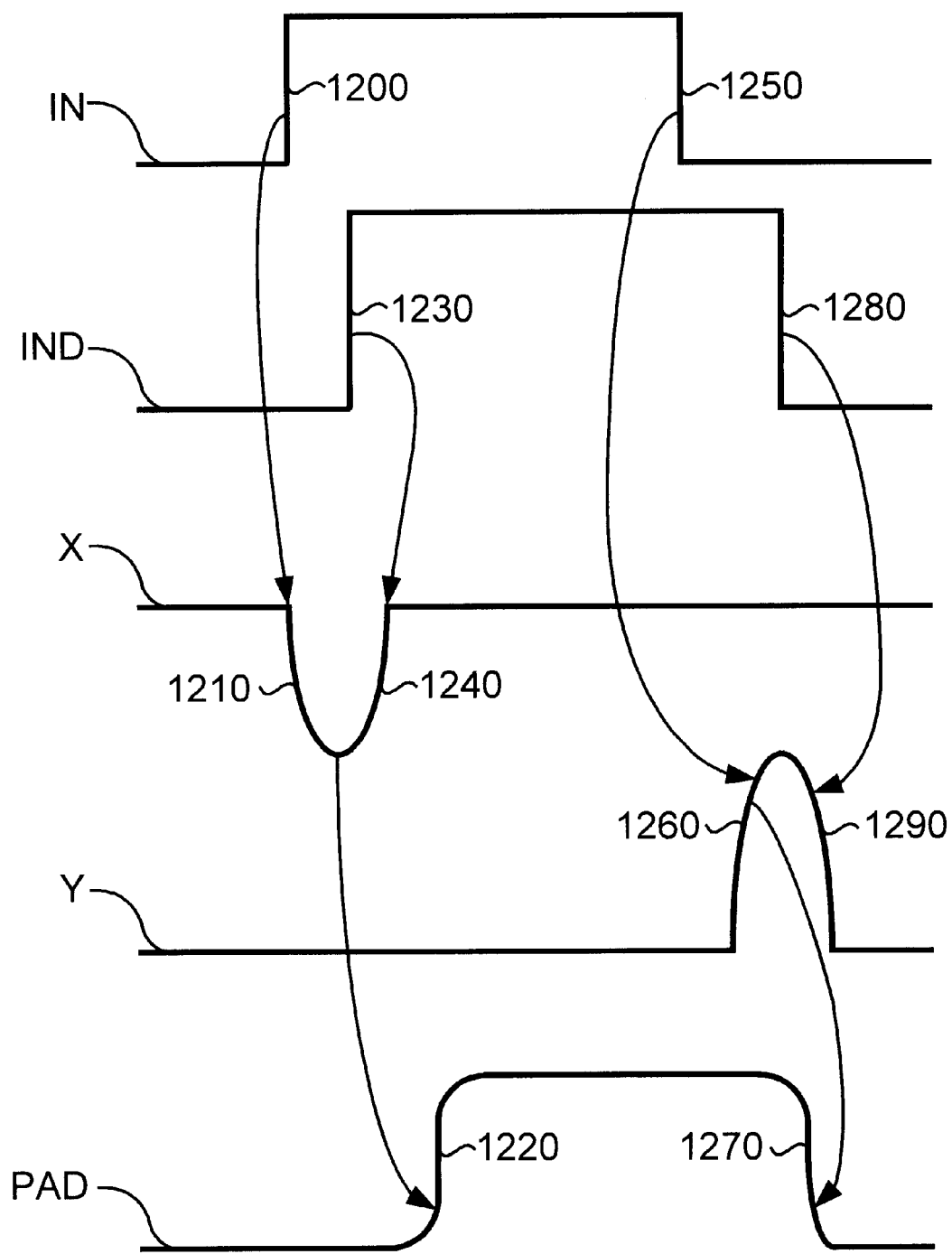
FIG. 11 is a timing diagram of selected signals utilized by the circuit of FIG. 10.

FIG. 11 is a timing diagram of selected signals utilized by the circuit of FIG. 10 and is used herein to explain the operation of the circuit 64C. FIG. 11 illustrates the input signal (IN), a delayed version of the input signal (IND), the signal at the gate of transistor I3, which is labeled as node X, the signal at the gate of transistor I4, which is labeled as node Y, and the signal at the PAD node.

The rising edge 1200 of the IN signal triggers the falling edge 1210 of the X signal, which in turn triggers the rising edge 1220 of the PAD signal. The rising edge 1230 of the IND signal causes the rising edge 1240 of the X signal. Similarly, the falling edge 1250 of the IN signal triggers the rising edge 1260 of the Y signal, which in turn triggers the falling edge 1270 of the PAD signal. The falling edge 1280 of the IND signal causes the falling edge 1290 of the Y signal.

When the input signal (IN) switches from a low logic level to a high logic level, the following occurs. First, transmission gate 1028 is disabled, and transistor 1018 is turned on, thereby causing the voltage at node Y to be ground to turn off the I4 transistor. Second, transmission gate 1024 is enabled, and transistor 1014 is turned off so that the voltage at node X can discharge (e.g., falling edge of signal X) through transmission gate 1024 and inverter 1034 to ground. When the IND signal is asserted, the voltage at node X is charged up to a high voltage, thereby turning the I3 transistor off. Accordingly, transistor I3 provides a dynamic drive current during the low to high transition in the IN signal. Similarly, transistor I4 provides a dynamic sink current during the high to low transition in the IN signal.

The foregoing description has provided numerous examples of the present invention. It will be appreciated that various modifications and changes may be made thereto without departing from the broader spirit and scope of the invention as set forth in the appended claims. One such modification involves the use of PMOS transistors instead of NMOS transistors as shown and the provision of suitable gate voltages for proper operation.

What is claimed is:

1. A dynamic impedance adjustment circuit for coupling to a load comprising:
    a) a first input for receiving an input signal;
    b) an output coupled to the load at an output node and for providing an output current to the load;
    c) a variable impedance output driver coupled to the output node; wherein the variable impedance output driver has a variable impedance; and
    d) an impedance adjustment control circuit, coupled to the output node and the variable impedance output driver, that includes a one-shot circuit; wherein the impedance adjustment control circuit receives the input signal and responsive thereto employs the one-shot circuit to selectively change the variable impedance of the variable impedance output driver.

2. The circuit of claim 1 wherein the variable impedance output driver includes a source transistor having a control node and a sink transistor having a control node;
    wherein the one-shot circuit receives the input signal and based thereon generates a one-shot output signal;
    wherein the dynamic impedance adjustment circuit further comprises
        a pre-driver preset circuit coupled to the variable impedance output driver for receiving the one-shot output signal and for pre-setting the control node of one of the source transistor and the sink transistor to a first predetermined voltage based on the one-shot output signal; and
        an output feedback driver coupled to the output node for changing the control node affected by the pre-driver preset circuit to a second predetermined voltage based on the voltage at the output node.

3. The circuit of claim 1 wherein the dynamic impedance adjustment circuit
    upon detecting a rising edge in the input signal, provides a dynamic source current for a first predetermined duration; and
    upon detecting a falling edge in the input signal, provides a dynamic sink current for a second predetermined duration.

4. The circuit of claim 2 wherein a modified signal that is based on the input signal is generated; wherein the output feedback driver includes a first transmission gate for receiving the modified input signal and for selectively coupling a delayed version of the input signal to the control node of the source transistor based on the modified input signal; and a second transmission gate for receiving the modified input signal and for selectively coupling the delayed version of the input signal to the control node of the sink transistor based on the modified input signal.

5. The circuit as in claim 2 wherein the one-shot circuit includes a one-shot pulse generator for receiving the input signal and for selectively pre-setting a first internal node to one of a first voltage and a second voltage and a second internal node to one of the first voltage and the second voltage based on the input signal; wherein the first internal node and the second internal node are complimentary.

6. The circuit as in claim 2 wherein the dynamic impedance adjustment circuit includes a pre-driver preset circuit for selectively controlling the variable impedance driver to provide a dynamic source current or dynamic sink current for a predetermined period of time after transitions in the input signal.

7. The circuit as in claim 1 further comprising: a resistor having a first terminal coupled to the variable impedance output driver and a second terminal coupled to the output node.

8. An output circuit comprising:
    a) an output driver coupled to the output node; and
    b) a dynamic impedance adjustment circuit coupled to the output driver; wherein the dynamic impedance adjustment circuit includes
        c_1) a variable impedance output driver coupled to the output node; wherein the variable impedance output driver has a variable impedance; and
        c_2) an impedance adjustment control circuit, coupled to the output node and the variable impedance output driver, that includes a one-shot circuit; wherein the impedance adjustment control circuit receives an input signal and responsive thereto employs the one-shot circuit to selectively change the variable impedance of the variable impedance output driver.

9. The output circuit of claim 8 wherein the impedance adjustment control circuit receives an input signal having at least one rising edge and at least one falling edge, detects rising edges and falling edges of the input signal, when a rising edge on the input signal is detected, employing a one-shot circuit to change the variable impedance of the variable output driver from the first impedance to the second impedance for a first predetermined duration; and when a falling edge on the input signal is detected, employing a one-shot circuit to change the variable impedance of the variable output driver from the second impedance to the first impedance for a second predetermined time.

10. The circuit as in claim 9 wherein the first impedance matches an external PCB trace impedance.

11. The circuit as in claim 9 wherein the second impedance is less than the first impedance.

12. The circuit as in claim 9 further comprising: a resistor having a first terminal coupled to an output driver and a second terminal coupled to a variable impedance.

13. The output circuit of claim 9 wherein after the first predetermined duration, the impedance adjustment control circuit changes the variable impedance back to the first impedance; and
    wherein after the second predetermined duration, the impedance adjustment control circuit changes the variable impedance back to the second impedance.

14. The output circuit of claim 8 further comprising:
    an output enable control circuit coupled to the output driver that includes a first input for receiving the input signal, a second input for receiving an enable signal, a first output for generating a first control signal, and a second output for generating a second control signal;
    wherein the first control signal and the second control signal control the output driver.

15. In an interface circuit having a dynamic impedance adjustment circuit that includes an input for receiving an input signal and a variable output driver that has a variable impedance, a method for dynamically adjusting the variable impedance of the variable output driver comprising the steps of:
  a) detecting transitions of the input signal that includes a rising edge and a falling edge;
  b) upon detecting a rising edge on the input signal, employing a one-shot circuit to change the variable impedance of the variable output driver from a first impedance to a second impedance for a first predetermined duration and thereafter to change the variable impedance back to the first impedance; and
  c) upon detecting a falling edge on the input signal, employing a one-shot circuit to change the variable impedance of the variable output driver from the second impedance to the first impedance for a second predetermined duration and thereafter to change the variable impedance back to the second impedance.

16. The method of claim 15 wherein the step of upon detecting a rising edge on the input signal, employing a one-shot circuit to change the variable impedance of the variable output driver from a first impedance to a second impedance for a first predetermined duration includes the step of after the first predetermined duration, changing the variable impedance back to the first impedance.

17. The method of claim 15 wherein the step of upon detecting a falling edge on the input signal, employing a one-shot circuit to change the variable impedance of the variable output driver from the second impedance to the first impedance for a second predetermined duration includes the step of after the second predetermined duration, changing the variable impedance back to the second impedance.

* * * * *